United States Patent [19]
Solina et al.

[11] Patent Number: 5,530,712
[45] Date of Patent: Jun. 25, 1996

[54] METHOD OF AND DEVICE FOR CONTROLLING THE PEAK POWER OF A LASER TRANSMITTER IN DISCONTINUOUS OPTICAL TRANSMISSION SYSTEMS

[75] Inventors: Paolo Solina, Grugliasco; Maurizio Valvo, Leini', both of Italy

[73] Assignee: CSELT - Centro Studi E Laboratori S.p.A., Turin, Italy

[21] Appl. No.: 419,030

[22] Filed: Apr. 10, 1995

[30] Foreign Application Priority Data

May 21, 1994 [IT] Italy .................. TO94A0405

[51] Int. Cl.⁶ .................................................. H01S 3/13
[52] U.S. Cl. .......................................... 372/31; 372/38
[58] Field of Search ........................................ 372/31, 38

[56] References Cited

U.S. PATENT DOCUMENTS

| 4,733,398 | 3/1988 | Shibagaki et al. | 372/31 |
| 5,394,416 | 2/1995 | Ries | 372/31 |
| 5,408,485 | 4/1995 | Ries | 372/38 |

OTHER PUBLICATIONS

"Semiconductor Device for Optical Communication", Springer Verlag Jan. 1982, H. Kessel et al, pp. 182–188.

*Primary Examiner*—Rodney B. Bovernick
*Assistant Examiner*—Robert E. Wise
*Attorney, Agent, or Firm*—Herbert Dubno

[57] ABSTRACT

A method and apparatus is disclosed for modulating a laser by a current resulting from the combination fo a threshold current and a current due to a data signal and in which a fraction of the laser output signal is taken and converted into a monitoring current, such monitoring current is sampled, an actual value of the peak power is obtained as an average over a number of samples of the monitoring current, the actual value of the peak power thus found is compared with a desired value of the peak power and an updated value for the laser threshold current is obtained from the difference, if any, between the desired value and the actual value, the updated value being such as to compensate for the difference.

10 Claims, 3 Drawing Sheets

5,530,712

METHOD OF AND DEVICE FOR CONTROLLING THE PEAK POWER OF A LASER TRANSMITTER IN DISCONTINUOUS OPTICAL TRANSMISSION SYSTEMS

SPECIFICATION

1. Field of the Invention

The present invention relates to an optical communications system and, more particularly, to a method of and a device for controlling the peak power of a laser transmitter in discontinuous transmission system.

In particular, the invention can be applied to burst mode optical transmitters, like those utilized in subscriber optical terminations in passive optical networks based on Time Division Multiple Access (TDMA).

2. Background of the Invention

It is well known that a laser transmitter shows peak power variations related with temperature variations and with the ageing of the component. It is therefore common practice to provide lasers with systems for controlling the output power to compensate these variations and, in particular, to compensate variations in the threshold current. Conventional control techniques, designed for continuous transmissions, entail the use of a monitoring detector which takes a portion of the output power and provides a signal proportional to the average power, which signal is sent into a very low frequency control loop. A description of the conventional control techniques can be found in "Semiconductor Devices for Optical Communication", Springer-Verlag 1982, edited by H. Kressel, Chapter 5.6 Laser Drivers, P. W. Shumate and M. Di Domenico, Jr., pages 182–188.

In a TDMA optical network, transmitters at the subscriber's side send data packets over the line in a discontinuous manner (burst mode), since they share the same transmission network. Furthermore, there is no information on data statistics and on the average value of the signal within the packets to be transmitted. Therefore, conventional systems cannot be used, as they just rely on measuring the average power. Moreover, monitoring detectors present in commercial laser modules, because of their limited frequency response, do not allow realizing peak power control systems for high transmission rates (of the order of the hundreds of Mbits/s or of some Gbits/s, or even higher).

OBJECT OF THE INVENTION

The object of the invention is to provide a method and a device that allow the control of the peak object power of the laser, so as to take into account the variations in the laser characteristics, even in the case of high bit rate burst mode transmissions.

SUMMARY OF THE INVENTION

According to the invention, a method is thus provided in which the laser is modulated by a current resulting from the combination of a threshold current and a current due to a data signal and in which a fraction of the laser output signal is taken and converted into a monitoring current, such monitoring current is sampled, an actual value of the peak power is obtained as an average over a predetermined number of samples of the monitoring current, the actual value of the peak power thus found is compared with a desired value of the peak power and an updated value for the laser threshold current is obtained from the difference, if any, between the desired value and the actual value, said updated value being such as to compensate said difference.

The invention also provides a device for carrying out the method, comprising:

a sampling circuit of the monitoring current; and a processing unit arranged to: obtain an actual value of the peak power as an average over a predetermined number of monitoring current samples; compare the actual value of the peak power thus found with a desired value of this power; obtain from the difference between the desired value and the actual value an updated value for the laser threshold current, said updated value being such as to compensate said difference; feed the updated value to the threshold current generator.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
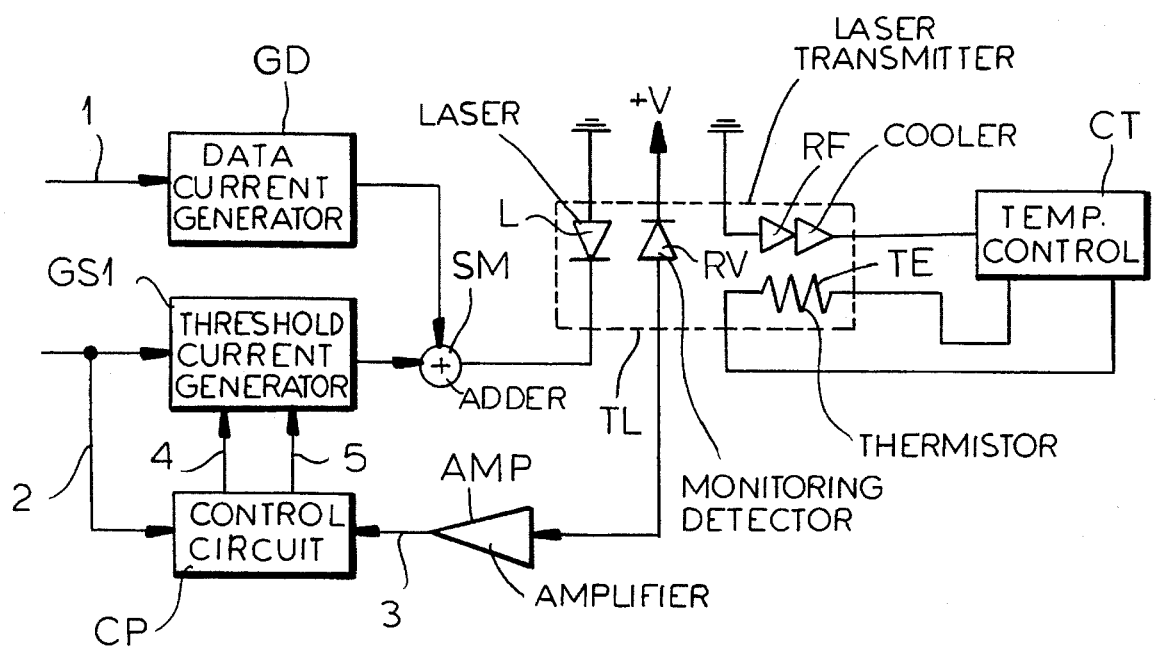
FIG. 1 is a block diagram of the subscriber's transmitter of a discontinuous transmission system employing the invention.

FIG. 1 is a diagram of the subscriber's optical transmitter of a passive optical network in TDMA technique. Where required, reference will be made by way of non-limiting example to a 622 Mbit/s transmission organized into ATM cells of 53 bytes with a 3 byte preamble, including a 1 byte guard time and a unique word comprising 3 initial bits, which are all 1's. Moreover, it is assumed that the transmitter is switched off during guard times, so that no optical power is on the line during those times.

A commercial laser transmitter TL includes, in addition to actual laser L, a controlling or monitoring detector RV and possibly a cooling device RF and a thermistor TE associated to conventional external devices CT for temperature control. Laser L is modulated by a current obtained by combining in an adder SM a current $I_d$ due to the data signal and a threshold current $I_s$, which currents are supplied by respective generators GD, GS1. The two generators receive from a data source, not shown, the data signal and respectively a cell envelope signal, which allows GS1 to be switched on in correspondence with the rising edge of the first bit of the packet and to be switched off in correspondence with the falling edge of the last bit. The two signals are present on respective wires 1,2.

Threshold current generator GS1 is driven by a peak power control circuit CP, which constitutes the subject matter of the invention. Circuit CP is based on the rapid acquisition, for a certain number of consecutive cells, of value $I_m$ of the output current of detector RV after the first 3 bits of the unique word and on an averaged processing of the acquired data. Through these processing operations, control circuit CP determines the actual value of the peak power, compares such a value with a predetermined reference value and on the basis of this comparison it calculates and provides threshold current generator GS1 with a correct value for threshold current $I_s$. Output current $I_m$ from detector RV is supplied to control circuit CP by means of a wire 3, after it has been amplified in a wideband amplifier AMP of which the gain and the cut-off frequency can be adjusted to compensate differences in response and bandwidth between different detectors. Control circuit CP provides threshold current generator GS1 with the correct value of $I_s$ through a connection 4, together with a loading command sent through wire 5. Circuit CP also receives, through wire 2, the cell envelope signal, which is utilized to obtain the necessary timing signals for the operations of control circuit CP.

Figure 2:
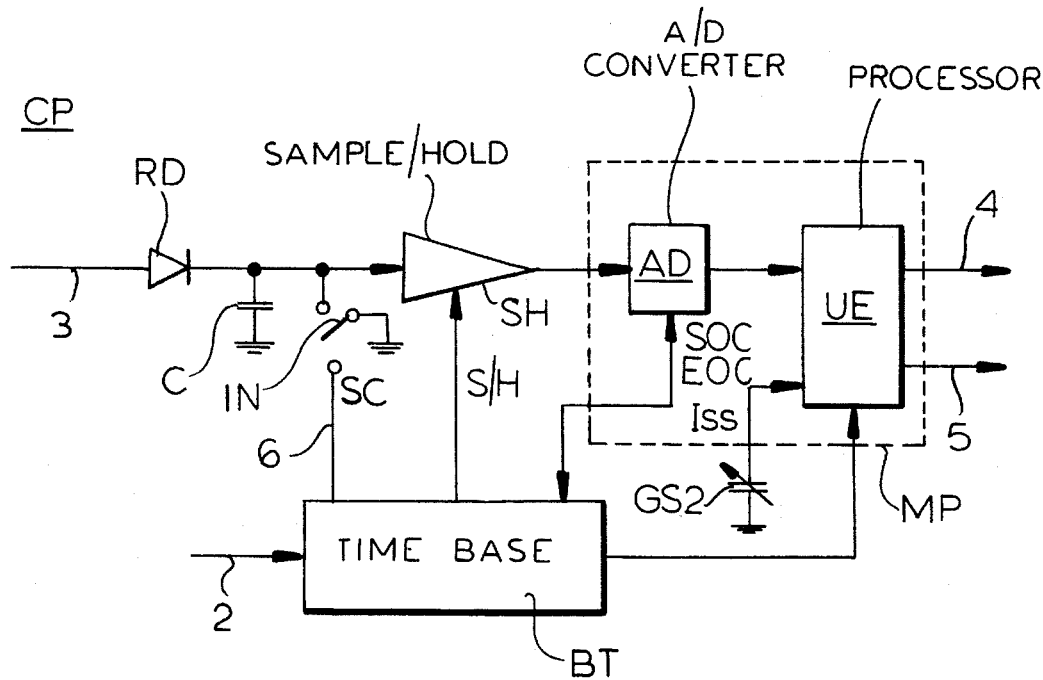
FIG. 2 is a diagram of the control device of the peak power, according to the invention.

As shown in FIG. 2, circuit CP includes a rectifier RD to rectify the signal present over wire 3 and a capacitor C that memorizes the rectified signal and that is discharged at the end of each packet, regardless of what occurs in the remaining portion of the circuit; in particular, capacitor C remains grounded, through a switch IN, for a period beginning at the falling edge of the cell envelope signal and corresponding to the duration of a few bits (typically 2 or 3). Switch IN is controlled by a signal SC supplied over wire 6 by a time base BT which obtains the timing signals required for the operation of control circuit CP from the cell envelope signal present over wire 2. Memory capacitor C is not indispensable; however, its presence allows wider tolerances for the sampling instant and the use of slower, and thus less expensive, sample and hold circuits. The rectified signal is then supplied to a sample and hold circuit SH, controlled by the time base BT. The signal leaving circuit SH, converted into digital form by an analogue-to-digital converter AD, is supplied to a processing unit UE which performs the operations required to obtain value $I_s$. These operations will be described in more detail later on. Converter AD receives from time base BT a start-of-conversion signal SOC and generates an end-of-conversion signal EOC; during conversion the acquisition of new samples is inhibited and therefore the end-of-conversion signal also constitutes an enabling signal for the sample and hold circuit SH.

Taking into account the processing times of AD, it may happen that the acquisition of the peak value is not accomplished in correspondence with all the cells. In particular in the example mentioned above each cell lasts about 0.7 μs, while the conversion time of converter AD is of about 20 μs and during that time the acquisition of new samples remains inhibited. This fact however has no importance, because peak power variations are normally very slow with respect to the minimum time interval between subsequent samples.

At the end of the processing operations, the computed value $I_s$ is presented on connection 4 and transformed into analog form in a digital-to-analog converter, not shown, which is part of generator GS1; loading of $I_s$ into generator GS1 is controlled by the signal present over wire 5.

Note that converter AD and processing unit UE may both be integrated into a single commercial microprocessor MP.

The processing operations performed by UE are as follows.

Let be: $I_s$=value of the threshold current to be computed, $I_{si}$=set value of the threshold current, $I_{mod}$=total modulating current given by the sum of the threshold current and of data current $I_d$, $P_p$=peak power, $P_r$=peak power to be maintained (reference), $\eta_1$=opto-electric conversion efficiency of photodiode RV, $\eta_2$=differential quantum efficiency of the laser.

The processing unit receives a number N of consecutive samples of current $I_m$ supplied by detector RV and obtains $I_p$ and $P_p$ for each sample. $I_p$ is computed according to relation $$I_m(t)=I_p(1-e^{-t/\tau}) \tag{1}$$

where t is the duration of the aforesaid 3 bits of the unique word (4.8 ns in the example under consideration) and τ is the charging time constant of the overall capacity of detector RV and amplifier AM. Peak power $P_p$ is obtained from $I_p$ according to relation $P_p=I_p/\eta_1$. At the end of the sequence of samples, UE computes the average $P_p^*$ of the values $P_p$ found, compares it with desired value $P_r$ and computes the variation of the total modulating current, given by:

$$\Delta I_{mod}=(P_r-P_p^*)\eta_2 \tag{2}$$

On the other hand, since no control is performed on $I_d$:

$$\Delta I_{mod}=(I_s+I_d)-(I_{si}+I_d)=I_s-I_{si}=\Delta I_s \tag{3}$$

Figure 3:
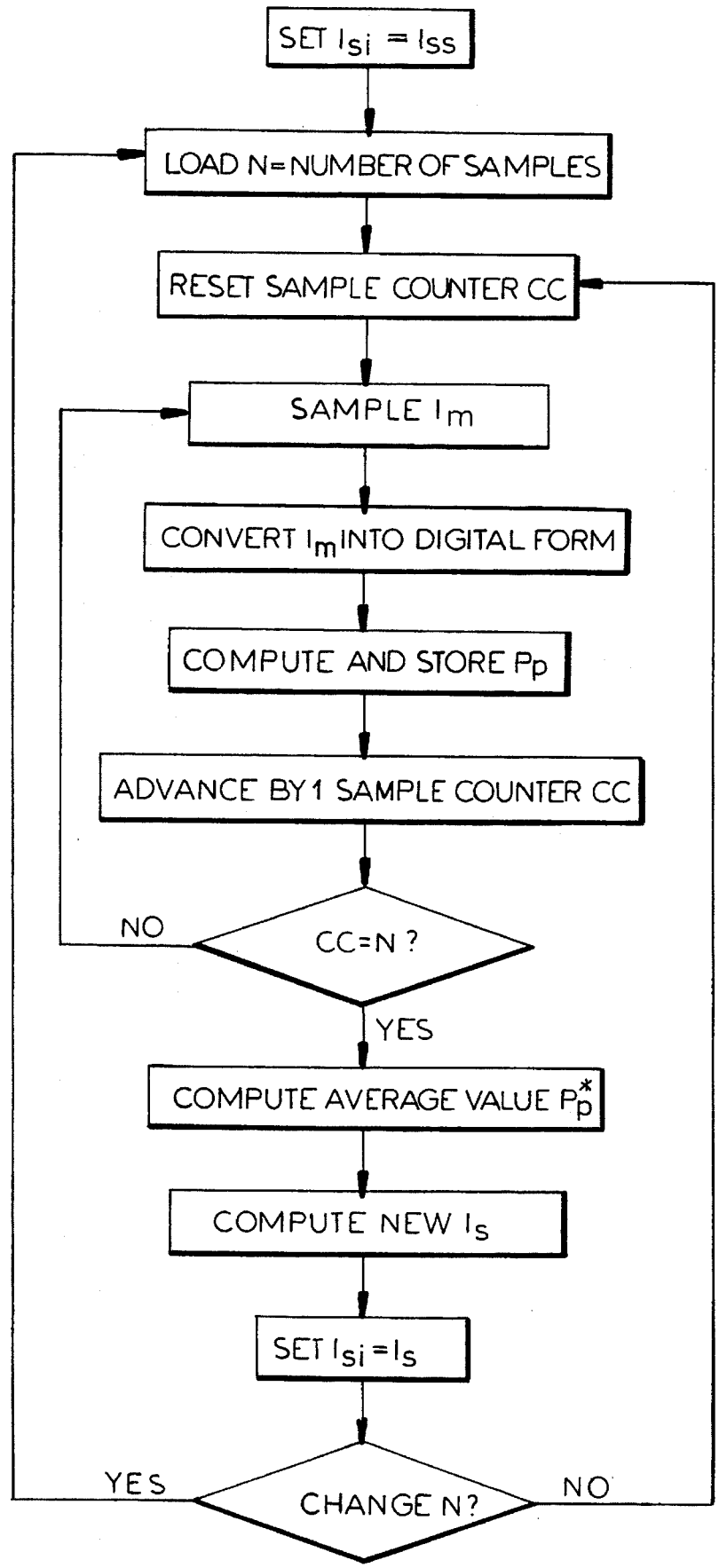
FIG. 3 is a flow chart of the operations of the processing unit of the device.

By equating the second members of expressions (2) and (3), the new threshold current value $I_s=I_{si}+(P_r-P_p^*)/\eta_2$ to be supplied to GS1 is obtained. The circuit will be initialized by loading an initial value of the threshold current $I_{si}=I_{ss}$ into processing unit UE, where $I_{ss}$ corresponds to the nominal value of the threshold current of the laser at the beginning of its life. The loading of $I_{ss}$ is represented schematically by the presence of generator GS2, but obviously it will be possible to achieve such loading via software. At the end of each cycle of computation of the correct threshold current, the value of $I_{si}$ is updated with the new value of $I_s$. If two subsequent values of $P_p^*$ differ by a quantity higher than a preset threshold, then number N may be varied to have more frequent updates. The operations described are also represented in the flow chart in FIG. 3.

The presence of the analogue-to-digital converter upstream of the processing unit entails the introduction of a quantization error in the computation of value $I_s$: such error ultimately depends on the weight attributed to the least significant bit, such weight being defined by the ratio between the maximum value that current $I_s$ can assume and the number of configurations available for the conversion ($2^n$, where n is the parallelism of the converter); typically, 8-bit converters are used, and they ensure a sufficient degree of approximation.

The number of samples to be averaged will depend on the particular requirements of the transmitter: for example, it will be possible to choose either a more accurate correction (which requires a high number of samples) or a faster correction. The former case may occur when a temperature control is performed, so that there are no particular speed requirements and it is possible to average even as many as one hundred samples; on the contrary, if no temperature control is performed, then the requirement to operate quick corrections becomes dominant, so that, for typical transmission rates, the average is computed over a small number of samples, typically from 2 to 4. Since a burst transmission is involved, it may happen that a certain transmitter remains inactive for a relatively long period, so controlling the characteristic according to the present invention would not be possible; in reality, communication protocols currently in use prescribe that each transmitter signals its own efficiency by periodically sending a special cell along the network, and thus it will be possible to obtain, within such a time as to avoid control loss problems, a series of sampled values that allows performing the correction of the threshold current.

Figure 4:
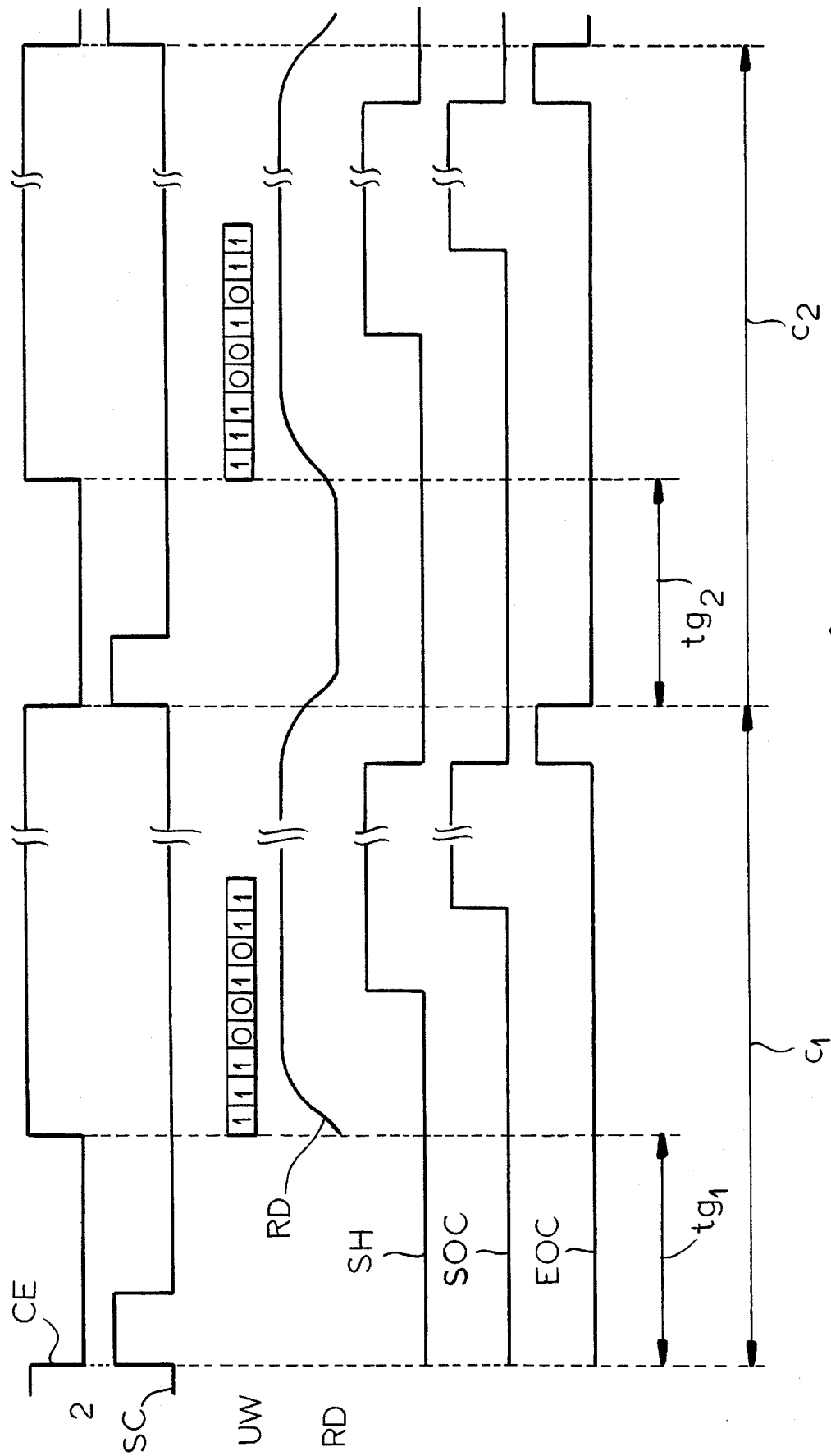
FIG. 4 is a timing diagram of some timing signals of the operations of the device.

FIG. 4 shows, for two cells $c_1$, $c_2$ involved in the sampling, the cell envelope (line 2), signal SC controlling the discharge of capacitor C, the unique word UW, the rectified response of detector RV to that word (line RD), signal S/H controlling sampling and holding in SH, signals SOC, EOC of start and end of conversion; $tg_1$, $tg_2$ indicate the guard times preceding the unique word of the two cells. The meaning of the various signals is clear from the previous description. Note that the sampling of the signal present at the output of RD can occur in correspondence with any point of the unique word following the third bit.

In the description above, the working hypothesis has been made that the variations in laser characteristic only concern threshhold current $I_s$, but in reality it is possible that its quantum efficiency, i.e. the ratio between optical power emitted and intensity of current applied, becomes altered too. In particular, quantum efficiency tends to decrease with time, as evidenced by the slope reduction of the power-current characteristic for currents above threshold current. To take that into account it would be possible to provide a second control loop, by using instruments capable of monitoring the aforesaid ratio and of acting in combination with the circuit described above in order to control power in a more accurate manner. The circuit described would then be disabled while the slope is controlled.

It is evident that many modifications, adaptations, integrations, variations and replacements of elements with others functionally equivalent may be made to the exemplary embodiment described above, without departing from the scope of the invention. In particular, it is clear that the processing unit could calculate the average of the values of current $I_m$ and obtain $P_p^*$ from an average value $I_m^*$.

We claim:

1. Method of controlling the peak power of a laser transmitter in a discontinuous transmission system, wherein the laser (L) is modulated by a modulating current resulting from the combination of a threshold current and a current due to a data signal and wherein a fraction of the output signal of the laser is taken and converted into a monitoring current, characterized in that said monitoring current is sampled, an actual value of the peak power is obtained as an average computed over a predetermined number of samples of monitoring current, the actual value of the peak power so obtained is compared with a desired value of the peak power and an updated value for the lasers threshold current is obtained from the difference, if any, between the reference value and the actual value, said updated value being such as to compensate said difference.

2. Method as claimed in claim 1, characterized in that, before sampling, the monitoring current is rectified and the rectified current is memorized in a memory capacitor (C).

3. Method as claimed in claim 1, characterized in that the samples of the monitoring current are converted into digital form.

4. Method of claim 1, characterized in that the discontinuous transmission is a packet transmission where each packet starts with a unique word comprising an initial group of bits with a preset logic value, and in that the sampling is performed in correspondence with said word, after the last bit of said group.

5. Method as claimed in claim 4, characterized in that the monitoring current is memorized for a period of time corresponding with the duration of a packet.

6. Device for controlling the peak power of a laser transmitter (TL) in a discontinuous transmission system, wherein the transmitter (TL) is modulated by a current resulting from the combination of a threshold current, supplied by a threshold current generator (GS1) and of a current due to a data signal, supplied by a data current generator (GD), and is associated with a monitoring detector (RV) which takes a fraction of the output signal from the laser and converts it into a monitoring current, characterized in that it comprises:

a circuit (SH) for sampling the monitoring current; and a processing unit (UE) arranged for: obtaining the actual value of the peak power as an average over a predetermined number of samples of the monitoring current; comparing the actual value of the peak power thus found with a desired value of that power; obtaining from the difference between the desired value and the actual value an updated value for the laser threshold current, such as to compensate said difference; supplying the updated value to the threshold current generator (GS1).

7. Device as claimed in claim 6, characterized in that it includes a memory capacitor (C) upstream of the sampling circuit (SH).

8. Device as claimed in claim 6, characterized in that the processing unit (UE) is initialized with a value of the threshold current corresponding with the nominal threshold current of the transmitter (TL) at the beginning of its life.

9. Device of claim 6, characterized in that the laser transmitter (TL) is a subscriber's transmitter of an optical communication network in TDMA technique, where packets are transmitted that start with a word comprising an initial group of bits with a preset logic value, and in that the sampling circuit (SH) is enabled to sample the monitoring current supplied by said detector (RV) in response to the portion of the starting word which follows said group of bits.

10. Device as claimed in claim 9, characterized in that the optical communication network in TDMA technique is a passive optical network and the packets are ATM cells.

* * * * *